US008698309B2

(12) United States Patent
Dohi et al.

(10) Patent No.: US 8,698,309 B2
(45) Date of Patent: Apr. 15, 2014

(54) SEMICONDUCTOR DEVICE

(75) Inventors: Shigefumi Dohi, Shiga (JP); Kouji Oomori, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/397,892

(22) Filed: Feb. 16, 2012

(65) Prior Publication Data
US 2012/0146244 A1 Jun. 14, 2012

Related U.S. Application Data

(63) Continuation of application No. PCT/JP2010/001553, filed on Mar. 5, 2010.

(30) Foreign Application Priority Data

Oct. 19, 2009 (JP) ................................ 2009-240508

(51) Int. Cl.
  *H01L 23/48* (2006.01)
  *H01L 23/02* (2006.01)

(52) U.S. Cl.
  USPC .............. 257/737; 257/686; 257/E23.069; 257/E25.006; 257/E25.021; 257/E25.027; 257/E23.085

(58) Field of Classification Search
  USPC .......... 257/686, 777, E25.006, E25.013, 257/E25.021, E25.027, E23.085, 737, 738, 257/773, E23.021, E23.069
  See application file for complete search history.

(56) References Cited

U.S. PATENT DOCUMENTS

| 7,928,557 | B2* | 4/2011 | Oi et al. ........................ 257/697 |
| 8,129,841 | B2* | 3/2012 | Pendse et al. ................. 257/737 |
| 2001/0038905 | A1* | 11/2001 | Takada et al. ................. 428/209 |
| 2002/0064930 | A1 | 5/2002 | Ishikawa |
| 2007/0145561 | A1* | 6/2007 | Tsai et al. ..................... 257/685 |
| 2008/0211079 | A1 | 9/2008 | Onodera |
| 2009/0179333 | A1 | 7/2009 | Martin et al. |

FOREIGN PATENT DOCUMENTS

| JP | 2000-299342 | 10/2000 |
| JP | 2002-26056 | 1/2002 |
| JP | 2007-311643 | 11/2007 |
| JP | 2008-166440 | 7/2008 |
| JP | 2008-270303 | 11/2008 |
| JP | 2009-170892 | 7/2009 |

OTHER PUBLICATIONS

International Search Report of PCT Application No. PCT/JP2010/001553, dated on May 25, 2010.

* cited by examiner

*Primary Examiner* — Jasmine Clark
(74) *Attorney, Agent, or Firm* — McDermott Will & Emery LLP

(57) ABSTRACT

A semiconductor device includes a first semiconductor device and second semiconductor device stacked on the first semiconductor device. The first semiconductor device includes a first interconnect substrate, a first semiconductor element provided on an upper surface of the first interconnect substrate, a first electrode provided on the upper surface of the first interconnect substrate, and an insulating layer having an opening portion through which part of the first electrode is exposed. The second semiconductor device includes a second interconnect substrate, a second semiconductor element provided on an upper surface of the second interconnect substrate, a second electrode provided on a lower surface of the second interconnect substrate, and an inter-device connection terminal connected to the second electrode. Part of the first electrode exposed through the opening portion has a smaller area than an area of the opening portion.

8 Claims, 12 Drawing Sheets

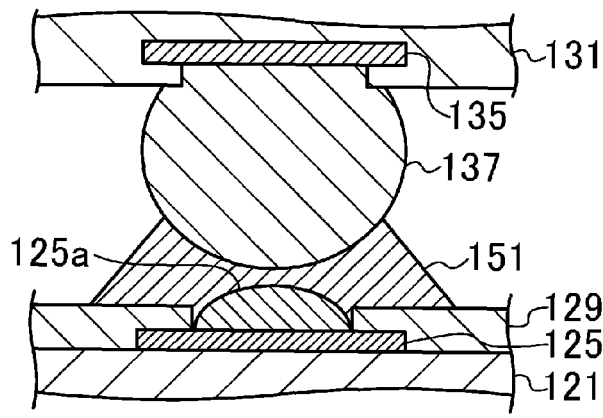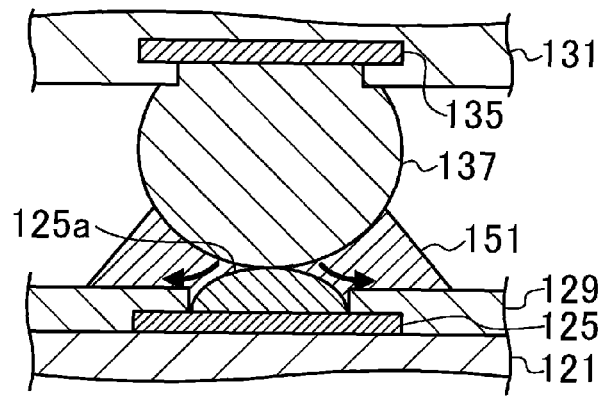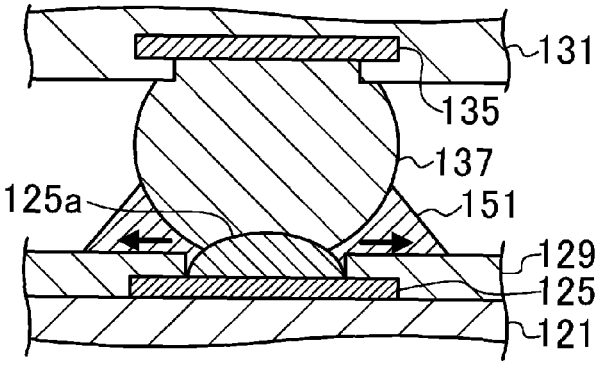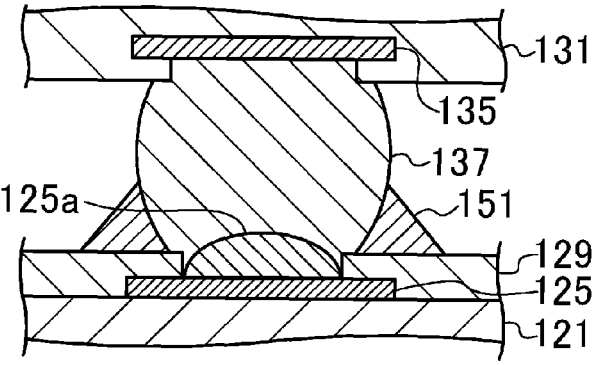

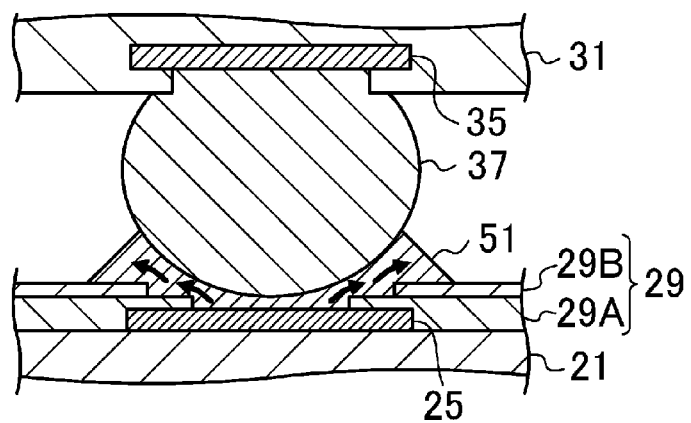
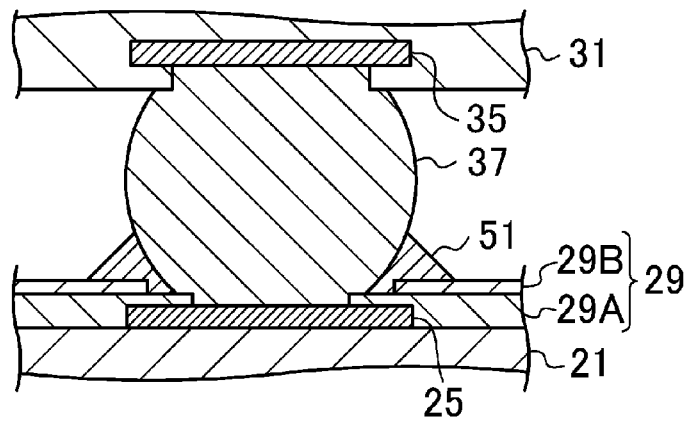

SEMICONDUCTOR DEVICE

CROSS-REFERENCE TO RELATED APPLICATIONS

This is a continuation of PCT International Application PCT/JP2010/001553 filed on Mar. 5, 2010, which claims priority to Japanese Patent Application No. 2009-240508 filed on Oct. 19, 2009. The disclosures of these applications including the specifications, the drawings, and the claims are hereby incorporated by reference in their entirety.

BACKGROUND

The present disclosure relates to a semiconductor device, and more particularly to a multilayer semiconductor device in which a plurality of semiconductor devices are connected together via solder balls.

To further reduce the size of electronic equipments, it is important to increase the mounting density of a semiconductor device used for the electronic equipments. A mobile device such as mainly a portable phone includes a multilayer semiconductor device (package on package or POP) in which a plurality of semiconductor devices (a semiconductor package) are stacked, thereby realizing high density mounting of the semiconductor device.

As methods for fabricating a mounting structure in which a plurality of semiconductor devices are stacked on a printed board, there are pre-stacking and on-board stacking.

In pre-stacking, first, a plurality of semiconductor devices are individually fabricated, and then, a pass/fail determination is made for each of the semiconductor devices. Next, the semiconductor devices are stacked to form a multilayer semiconductor device, and then, the obtained multilayer semiconductor device is electrically connected to a printed board.

In on-board stacking, a plurality of semiconductor devices are sequentially mounted one by one on a printed board to form a multilayer semiconductor device on the printed board.

In general, in a semiconductor device, a semiconductor element is provided on an upper surface of an interconnect substrate using a flip-on-chip method, etc. and an external connection terminal is formed on a lower surface of the interconnection substrate. In general, a semiconductor device in which a plurality of external connection terminals are arranged in a lattice pattern on a lower surface of an interconnect substrate is called area array semiconductor device, and a semiconductor device in which external connection terminals are made of solder balls is called ball grid array (BGA) semiconductor device. To reduce the thickness of a mounting structure as small as possible, solder balls, etc. are arranged in part of an interconnect substrate located outside a semiconductor element.

In a BGA semiconductor device in which a semiconductor element is flip chip connected to an interconnect substrate, the thermal expansion coefficient is different between the semiconductor element and the interconnect substrate, and thus, the semiconductor device is warped during fabrication. Furthermore, the semiconductor device is warped more greatly as the thickness of the BGA semiconductor device is reduced.

If semiconductor devices are greatly warped, a large stress is applied to the semiconductor device when a multilayer semiconductor device is formed. Specifically, the stress is increased at solder joint portions which join stacked semiconductor devices, thus causing defective electrical conduction.

To solve the above-described problems, it has been discussed that a bonding area of a portion where an upper surface of an interconnect substrate of a lower semiconductor device and solder balls are bonded together is reduced to be smaller than that of a bonding area of a portion where a lower surface of an interconnect substrate of an upper semiconductor device and the solder balls are bonded together (see, for example, Japanese Patent Publication No. 2007-311643). In this manner, the bonding area can be set according to the magnitude of a stress applied thereto.

SUMMARY

However, the above-described conventional multilayer semiconductor device has the following problems. For example, a distortion generated when a first semiconductor device and a second semiconductor device are stacked is caused not only by a difference in thermal expansion coefficient between an interconnect substrate and a semiconductor element, but also by heat generation in a reflow process in which the two semiconductor devices are connected together. Due to the heat generation in the reflow process, each of the two semiconductor devices is warped, and then, is freely deformed. Thus, solder balls of the first semiconductor device are separated from an upper surface of an electrode of the second semiconductor device in the reflow process, so that the first semiconductor device and the second semiconductor device cannot be electrically connected. This problem cannot be solved by changing the bonding areas.

The above-described inconvenience can possibly occur not only when pre-stacking is used, but also when on-board stacking is used.

Furthermore, the present inventors found another factor which causes problems in forming a multilayer semiconductor device.

It is therefore an object of the present disclosure to realize a multilayer semiconductor device in which the occurrence of a defective connection between semiconductor devices is prevented or reduced and which has high connection reliability.

To achieve the above-described object, according to the present disclosure, a semiconductor device has a configuration which allows a connection auxiliary material to be sufficiently pushed away from above an electrode when providing a connection between an inter-device connection terminal and the electrode.

Specifically, a first example semiconductor device includes a first semiconductor device and a second semiconductor device stacked on the first semiconductor device. The first semiconductor device includes a first interconnect substrate, a first semiconductor element provided on an upper surface of the first interconnect substrate, a first electrode provided on the upper surface of the first interconnect substrate, and an insulating layer which is provided on the upper surface of the first interconnect substrate and has an opening portion through which part of the first electrode is exposed. The second semiconductor device includes a second interconnect substrate, a second semiconductor element provided on an upper surface of the second interconnect substrate, a second electrode provided on a lower surface of the second interconnect substrate, and an inter-device connection terminal connected to the second electrode. The part of the first electrode exposed through the opening portion has a smaller area than that of the opening portion.

In the first example semiconductor device, the part of the first electrode exposed through the opening portion has a smaller area than that of the opening portion. Thus, a connection auxiliary material existing on the first electrode can be caused to flow away into a space between the first electrode and the insulating film. Therefore, a connection between the first electrode and the inter-device connection terminal can be easily provided, and the occurrence of a defective connection of the first semiconductor device and the second semiconductor device can be prevented or reduced. Moreover, since the part of the electrode is exposed through the opening portion, adhesion between the first electrode and the first interconnect substrate can be increased, as compared to the case where the first electrode is completely exposed. Therefore, reliability of connection of the first semiconductor and the second semiconductor device can be further increased.

In the first example semiconductor device, the first electrode and the opening portion may have the same planar shape and area, and the opening portion may be formed so that the part of the first electrode and part of the first interconnect substrate on which the first electrode is not formed are exposed through the opening portion In this case, each of the planar shape of the first electrode and the planar shape of the opening portion may be a polygonal shape with n sides, and furthermore, the first electrode may be arranged in a position rotated relative to the opening portion by 180/n degrees.

Also, each of the planar shape of the first electrode and the planar shape of the opening portion may be a polygonal shape having a plurality of vertices. Furthermore, the plurality of vertices of the first electrode may be arranged so as not to overlap with the plurality of vertices of the opening portion.

In the first example semiconductor device, at least one of the respective planar shapes of the first electrode and the opening portion or the respective areas of the first electrode and the opening portion may be different from each other.

A second example semiconductor device includes a first semiconductor device and a second semiconductor device stacked on the first semiconductor device. The first semiconductor device includes a first interconnect substrate, a first semiconductor element provided on an upper surface of the first interconnect substrate, a first electrode provided on the upper surface of the first interconnect substrate, and an insulating layer which is provided on the upper surface of the first interconnect substrate and has an opening portion through which part of the first electrode is exposed. The second semiconductor device includes a second interconnect substrate, a second semiconductor element provided on an upper surface of the second interconnect substrate, a second electrode provided on a lower surface of the second interconnect substrate, and an inter-device connection terminal connected to the second electrode. The insulating layer includes a first layer and a second layer stacked in this order from a side thereof located closer to the first interconnect substrate. The opening portion includes a lower opening potion formed in the first layer and an upper opening potion formed in the second layer, and the upper opening portion has a larger width than a width of the lower opening portion.

In the second example semiconductor device, the opening portion includes a lower opening potion formed in the first layer and an upper opening potion formed in the second layer, and the upper opening portion has a larger width than a width of the lower opening portion. Thus, a connection auxiliary material existing on the first electrode can be pushed onto the first layer to spread thereon, and furthermore, be pushed onto the second layer to spread thereon. Therefore, by reducing the aspect ratio of the lower opening portion, a connection between the first electrode and the inter-device connection terminal can be easily provided. Moreover, the insulating layer has a two-layer structure, and thus, even when the thickness of the first layer is reduced to reduce the aspect ratio of the lower opening portion, the thickness of the entire insulating layer can be ensured.

In the second example semiconductor device, an aspect ratio of the lower opening portion may be 0.12 or less.

A third example semiconductor device includes a first semiconductor device and a second semiconductor device stacked on the first semiconductor device. The first semiconductor device includes a first interconnect substrate, a first semiconductor element provided on an upper surface of the first interconnect substrate, a first electrode provided on the upper surface of the first interconnect substrate, and an insulating layer which is provided on the upper surface of the first interconnect substrate and has an opening portion through which part of the first electrode is exposed. The second semiconductor device includes a second interconnect substrate, a second semiconductor element provided on an upper surface of the second interconnect substrate, a second electrode provided on a lower surface of the second interconnect substrate, and an inter-device connection terminal connected to the second electrode. The first electrode includes a raised portion with an upper end portion which protrudes from an upper surface of the insulating layer.

In the third example semiconductor device, the first electrode includes a raised portion with an upper end portion which protrudes from an upper surface of the insulating layer. Thus, a connection auxiliary material existing on the first electrode can be easily away from the first electrode regardless the aspect ratio of the opening portion. Therefore, a connection between the first electrode and the inter-device connection terminal can be easily provided, and the occurrence of a defective connection of the first semiconductor device and the second semiconductor device can be prevented or reduced.

In the third example semiconductor device, the upper end portion of the raised portion protrudes from the upper surface of the insulating layer by 10 μm or more.

In the third example semiconductor device, the raised portion is made of solder, copper, or tin.

According to the present disclosure, a multilayer semiconductor device in which the occurrence of a defective connection between semiconductor devices is prevented or reduced and which has high connection reliability can be realized.

BRIEF DESCRIPTION OF THE DRAWINGS

FIGS. 9A-9D are cross-sectional views illustrating respective steps for connecting semiconductor devices when the raised portion is provided in the first electrode.

FIG. 11A is a planar view illustrating an enlargement of part of the semiconductor device located around a first electrode. FIG. 11B is a cross-sectional view taken along the line of XIb-XIb of FIG. 11A.

FIGS. 15A and 15B are cross-sectional views illustrating respective steps for connecting semiconductor devices according to the variation of the one embodiment.

DETAILED DESCRIPTION

First, problems which the present inventors newly found will be described. An evaluation semiconductor device was first fabricated using pre-stacking as shown in FIGS. 1A-1D.

Figure 1A:
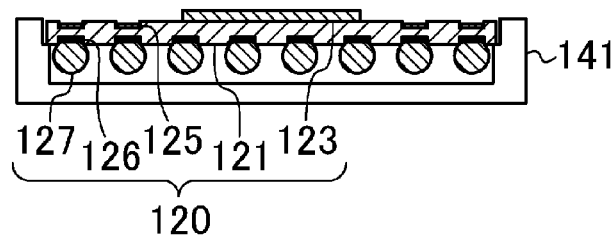
FIGS. 1A-1D are cross-sectional views illustrating respective steps for fabricating an evaluation semiconductor device.

First, as shown in FIG. 1A, a first semiconductor device 120 which will serve as a lower semiconductor device when being stacked is placed on a fixture jig 141. The first semiconductor device 120 includes a first semiconductor element 123 provided on an upper surface of a first interconnect substrate 121. First electrodes 125 are formed in part of the upper surface of the first interconnect substrate 121 located outside of the first semiconductor element 123. Solder balls 127 as substrate connection terminals are formed on a surface (a lower surface) of the first interconnect substrate 121 which is opposed to the surface on which the first semiconductor element 123 is provided.

Figure 1B:
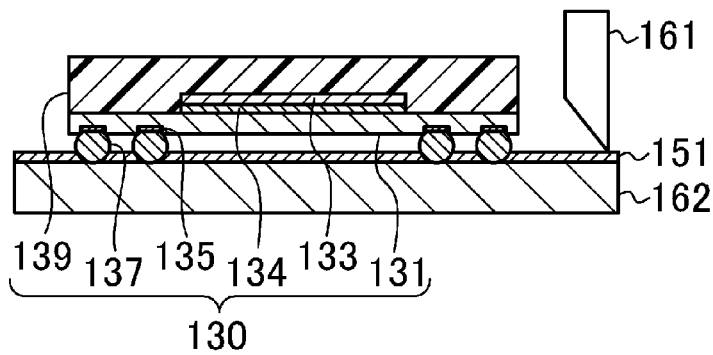

Next, as shown in FIG. 1B, a connection auxiliary material 151 is formed as a film over a squeegee base 162 by a squeegee 161. Subsequently, the connection auxiliary material 151 is transferred to solder balls 137 as inter-device connection terminals which are provided in a second semiconductor device 130. The second semiconductor device 130 which will serve as an upper semiconductor device when being stacked includes a second interconnect substrate 131, and a second semiconductor device 133 provided on an upper surface of the second interconnect substrate 131 with an adhesive 134 interposed therebetween. The solder balls 137 serve as inter-device connection terminals for connecting the first semiconductor device 120 and the second semiconductor device 130 together. The solder balls 137 are provided on second electrodes 135 which are provided on a surface (a lower surface) of the second interconnect substrate 131 which is opposed to the surface on which the second semiconductor device 133 is provided. The second semiconductor device 133 is mounted using a wire bonding technique, and sealed by a sealing resin 139. Note that the second semiconductor device 133 may be mounted using a flip chip technique.

Figure 1C:
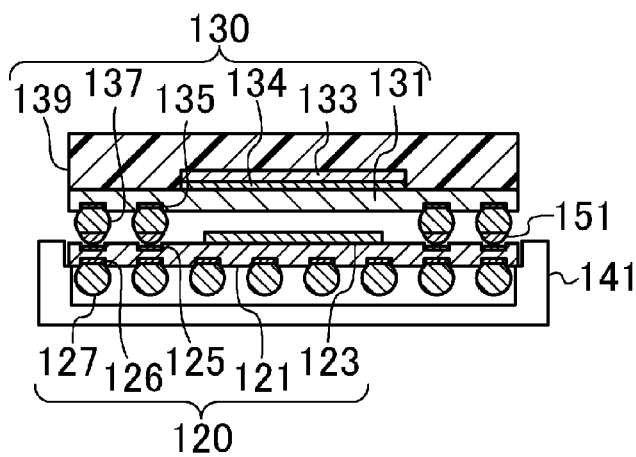

Next, as shown in FIG. 1C, the second semiconductor device 130 in which the connection auxiliary material 151 is transferred to the solder balls 137 is placed on the first semiconductor device 120.

Figure 1D:
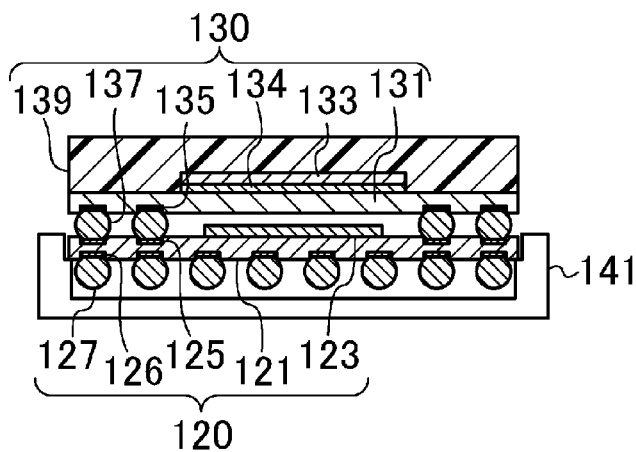

Next, a reflow process of FIG. 1D is performed to heat a joint portion of the first semiconductor device 120 and the second semiconductor device 130 up to around a temperature of 240-260° C., thereby melting the solder balls 137 so that the first semiconductor device 120 and the second semiconductor device 130 are electrically and physically connected together.

Finally, using an electrical checker, a confirmation is made that the first semiconductor device 120 and the second semiconductor device 130 are electrically connected is performed to make a pass/fail determination.

Figure 2:
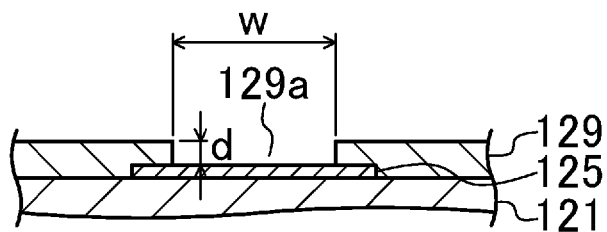
FIG. 2 is a cross-sectional view of an enlargement of a first electrode of the evaluation semiconductor device.
Figure 3:
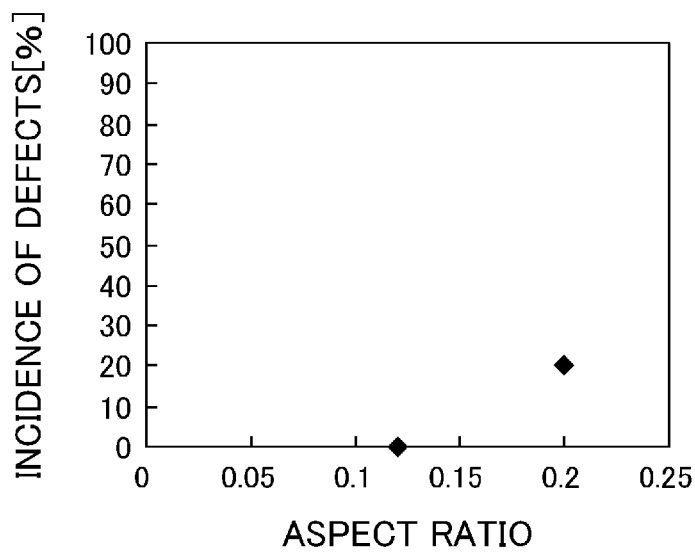
FIG. 3 is a plot showing the relationship between the incidence of defective connection and the aspect ratio for the evaluation semiconductor device.

FIG. 2 illustrates an enlargement of part in which a first electrode 125 is formed. An insulating layer 129 is formed on the first interconnect substrate 121 to have an opening portion 129a through which part of the first electrode 125 is exposed. The present inventors found that the incidence of defective connection in the evaluation semiconductor device varies depending on an aspect ratio, which is a value obtained by dividing a depth d of the opening portion 129a by a width w. FIG. 3 shows the relationship between the aspect ratio of the opening portion 129a and the incidence of defective connection. As shown in FIG. 3, as the aspect ratio of the opening portion 129a increases, defective connections occur.

Figure 4A:
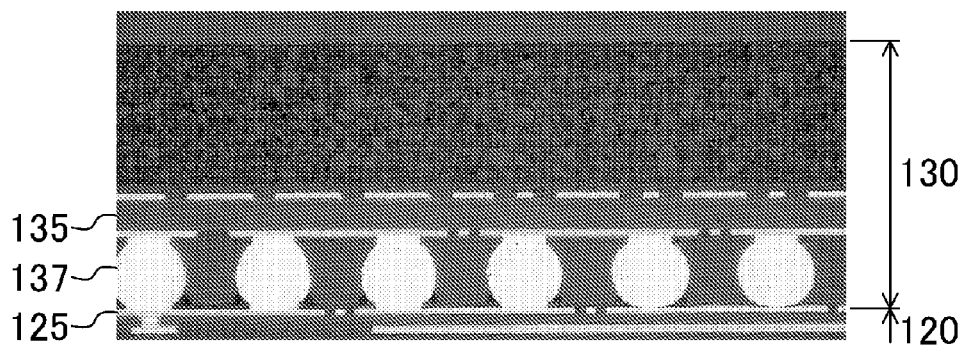
FIGS. 4A and 4B are photographs showing a cross-section of a semiconductor device in which a defective connection has occurred.
Figure 4B:
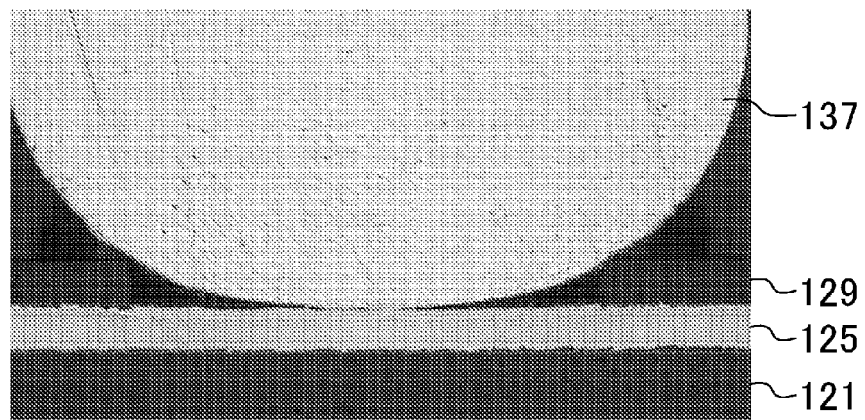

FIG. 4A shows a cross section of a semiconductor device in which a defective connection has occurred. FIG. 4B shows an enlargement of part of the semiconductor device in which the defective connection has occurred. As shown in FIGS. 4A and 4B, in the semiconductor device in which the defective connection has occurred, a gap was generated between the solder ball 137 and the first electrode 125. It is considered that the defective connections has occurred for the following reason.

A connection auxiliary material advantageously removes an oxide film on surfaces of electrodes and solder balls continuously during heating in a reflow process until the solder balls and the electrodes are brought into connection, and also prevents reoxidation during heating, and is, in general, used in fabricating a multilayer semiconductor device.

Figure 5A:
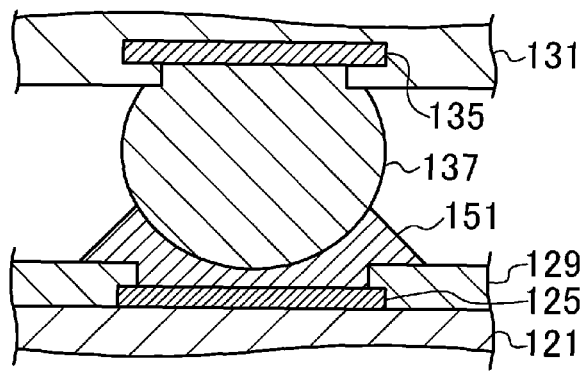
FIGS. 5A-5D are cross-sectional views illustrating respective steps for connecting semiconductor devices.
Figure 5B:
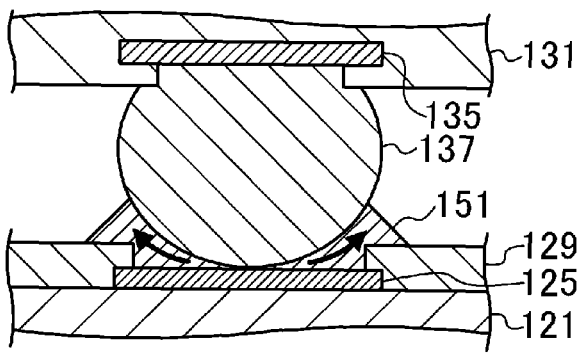
Figure 5C:
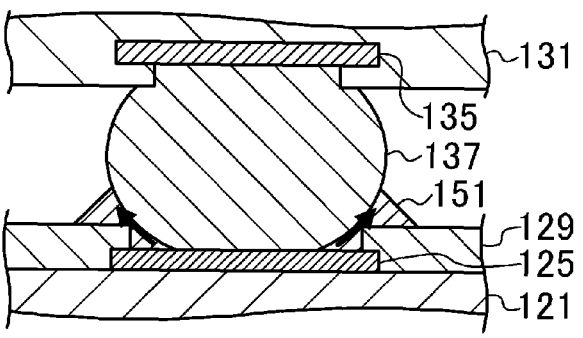
Figure 5D:
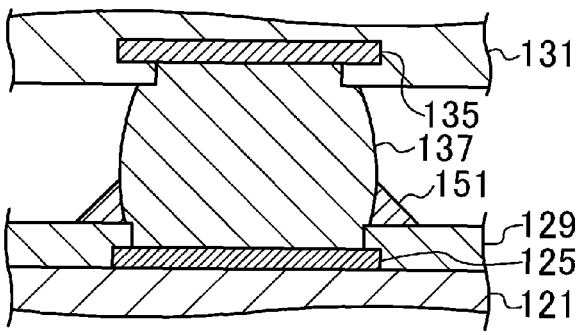

FIGS. 5A-5D are cross-sectional views illustrating respective steps of a reflow process for connecting the solder balls 137 and the first electrodes 125. FIG. 5A shows a step before the solder balls 137 are melted. Due to the action of the connection auxiliary material 151 induced by application of heat, an oxide film formed on surfaces of the first electrode 125 and the solder ball 137 is removed. Next, in a step of FIG. 5B, the first electrode 125 and the melted solder ball 137 push the connection auxiliary material 151 away to come to contact each other, and the first electrode 125 and the solder ball 137 form an alloy layer. Next, in a step of FIG. 5C, the melted solder ball 137 spreads over the first electrode 125 while pushing the connection auxiliary material 151 away from the surface of the first electrode 125. Next, in a step of FIG. 5D, the solder ball 137 is solidified to be electrically and physically connected with the first electrode 125.

Figure 6:
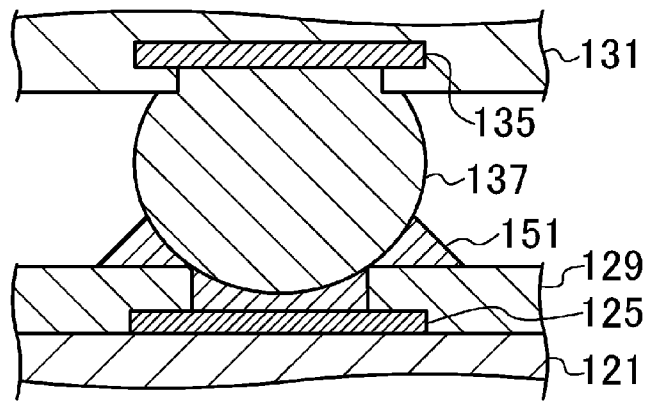
FIG. 6 is a cross-sectional view illustrating a state where a defective connection has occurred.

However, as shown in FIG. 6, when the aspect ratio of the opening portion 129a is large, the solder ball 137 cannot sufficiently push the connection auxiliary material 151 away. Thus, the connection auxiliary material 151 remains between the solder ball 137 and the first electrode 125, the solder ball 137 and the first electrode 125 cannot contact each other, thus resulting in a defective connection, presumably.

Figure 7:
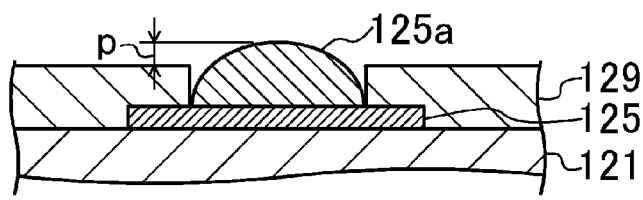
FIG. 7 is a cross-sectional view illustrating a state where a raised portion is provided in the first electrode.

To sufficiently push the connection auxiliary material 151 away and thereby bring the solder ball 137 and the first electrode 125 into contact, the aspect ratio may be reduced. Also, as shown in FIG. 7, it is presumed that when a raised portion 125a is provided in part of the first electrode 125 exposed through the opening portion 129a, the same advantages as those achieved when the aspect ratio is reduced can be achieved.

Figure 8:
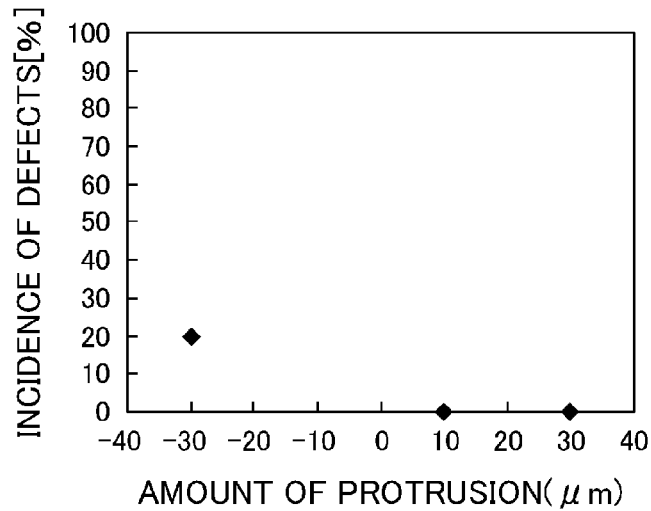
FIG. 8 is a plot showing the relationship between the incidence of defective connection and the amount of protrusion of the raised portion.

FIG. 8 shows the relationship between the amount p of protrusion of the raised portion 125a from an upper surface of the insulating layer 129 and the incidence of defective connection between the first semiconductor device 120 and the second semiconductor device 130. In FIG. 8, when the amount of protrusion is negative, an upper end portion of the raised portion 125a is located lower than the upper surface of the insulating layer 129. As shown in FIG. 8, the defective connection can be reduced by increasing the height of the raised portion 125a, and it has become clear that, specifically, the upper end portion of the raised portion 125a preferably protrudes from the upper surface of the insulating layer 129, and furthermore, the upper end portion of the raised portion 125a preferably protrudes from the upper surface of the insulating layer 129 by 10 μm or more.

FIGS. 9A-9D are cross-sectional views illustrating respective steps for connecting the solder balls 137 and the first electrodes 125 when each of the raised portions 125a is formed to have an upper end portion protruding from the upper surface of the insulating layer 129. As shown in FIG. 9B, because the first electrode 125 has the raised portion 125a protruding from the upper surface of the insulating layer 129, the melted solder ball 137 can easily push the connection auxiliary material 151 away from above the first electrode 125. Thus, the solder ball 137 and the raised portion 125a are easily brought into contact to form an alloy layer.

As described above, the present inventors have revealed that a defective connection occurs in a multilayer semiconductor device because a connection auxiliary material remains on electrodes. Also, the present inventors have found that the occurrence of a defective connection can be prevented or reduced by providing a configuration in which a connection auxiliary material can be easily pushed away when solder balls and electrodes are brought into contact. In the following embodiments, a multilayer semiconductor device in which the occurrence of a defective connection is prevented or reduced will be further described in detail.

(One Embodiment)

Figure 10:
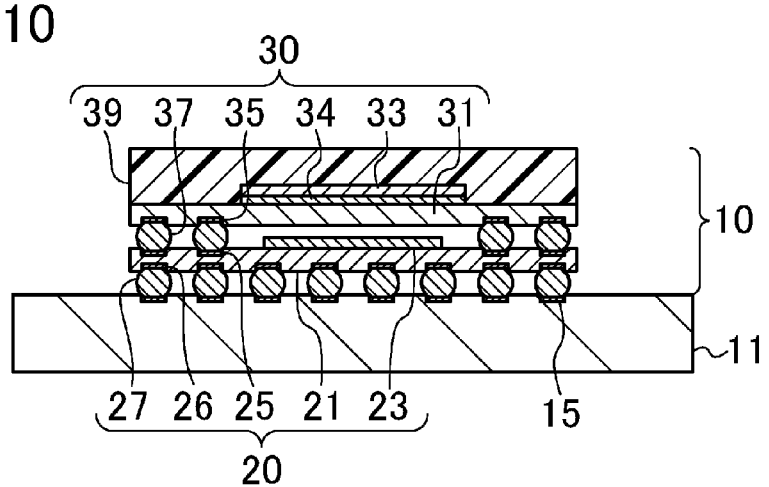
FIG. 10 is a cross-sectional view of a semiconductor device according to one embodiment.

FIG. 10 illustrates a cross-sectional configuration of a mounting structure according to one embodiment. A multilayer semiconductor device 10 is provided on an upper surface of a printed board 11 including printed board electrodes 15. The multilayer semiconductor device 10 includes a first semiconductor device 20 and a second semiconductor device 30 stacked on the first semiconductor device 20.

The second semiconductor device 30 includes a second interconnect substrate 31, second electrodes 35, and solder balls 37 as inter-device connection terminals. The second interconnect substrate 31 is a substrate on which an interconnect pattern (not shown) which is called interposer in general is formed.

A second semiconductor element 33 is provided on a center portion of an upper surface of the second interconnect substrate 31 with an adhesive 32 interposed therebetween. In this embodiment, the second semiconductor element 33 is mounted on the second interconnect substrate 31 using wire bonding. Electrode terminals (not shown) are provided in a circumferential portion of the second semiconductor element 33, and are connected to the interconnect pattern formed on the upper surface of the second interconnect substrate by wires (not shown). The second semiconductor element 33 and the wires are sealed by a sealing resin 39 formed on the second interconnect substrate 31.

The second electrodes 35 are formed on a lower surface of the second interconnect substrate 31. The solder balls 37 as inter-device connection terminals are connected to the second electrodes 35. The second electrodes 35 are provided in a lattice pattern in a circumferential portion of a lower surface of the second interconnect substrate 31. As described, the second electrodes 35 and the second semiconductor element 33 are arranged so as not to overlap each other, thereby allowing reduction in thickness of the second semiconductor device 30, as compared to the case where the second electrodes 35 and the second semiconductor element are arranged to overlap each other.

In the first semiconductor device 20, a first semiconductor element 23 is provided on a center portion of an upper surface of a first interconnect substrate 21 using a flip chip mounting technique, etc. The first interconnect substrate 21 includes first electrodes 25 formed on the upper surface thereof, and substrate connection electrodes 26 formed on a lower surface thereof. The first electrodes 25 are connected with the substrate connection electrodes 26 by interconnects (not shown) formed in the first interconnect substrate 21. Also, the first semiconductor element 23 is connected with the first electrodes 25 and the substrate connection electrodes 26 by interconnects. The first electrodes 25 are provided at positions which are located around the first semiconductor element 23 and correspond to the second electrodes 35 of the second semiconductor device 30. The substrate connection electrodes 26 are arranged in a lattice pattern, and solder balls 27 which are substrate connection terminals are connected to the substrate connection electrodes 26.

The solder balls 27 of the first semiconductor device 20 are connected to the printed board electrodes 15 provided in the printed board 11. The solder balls 37 of the second semiconductor device 30 are connected to the first electrodes 25 of the first semiconductor device 20.

Figure 11A:
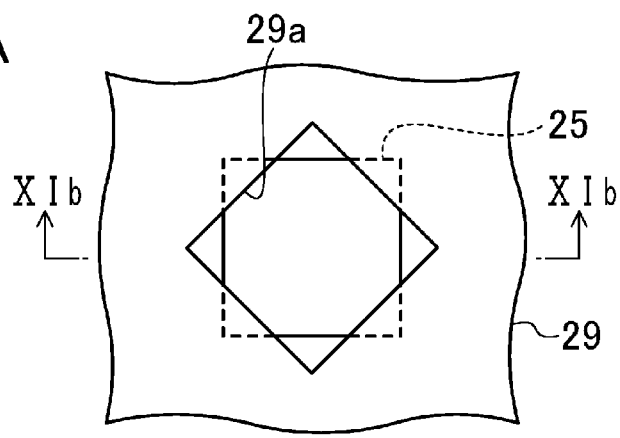
FIGS. 11A and 11B illustrates the semiconductor device of one embodiment.
Figure 11B:
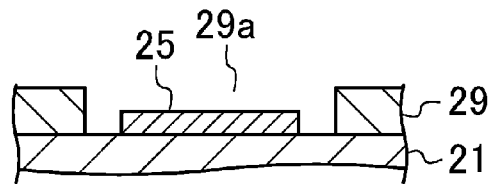

FIGS. 11A and 11B illustrate an enlargement of part surrounding the first electrode 25. FIG. 11A illustrates a planar configuration. FIG. 11B illustrates a cross-sectional configuration taken along the line XIb-XIb of FIG. 11A. As shown in FIGS. 11A and 11B, an insulating layer 29 is formed to cover an upper surface of the first interconnect substrate 21. The insulating layer 29 has an opening portion 29a through which part of the first electrode 25 is exposed. In FIGS. 11A and 11B, the first electrode 25 and the opening portion 29a have the same planner shape and area. Also, the first electrode 25 and the opening portion 29a are arranged to be offset by 45 degrees to each other and parts of the first electrode 25 and the opening portion 29a overlap. Thus, the opening portion 29a has a larger area than an area of part of the first electrode 25 exposed through the opening portion 29a. That is, the part of the first electrode 25 and part of the first interconnect substrate 21 in which the first electrode 25 is not formed are exposed through the opening portion 29a. Also, other part of the first electrode 25 is covered by the insulating layer 29.

Figure 12A:
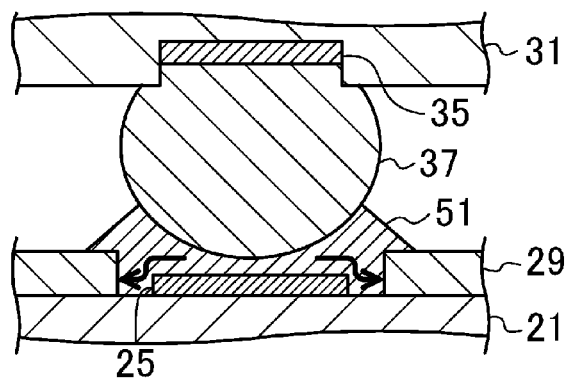
FIGS. 12A-12C are cross-sectional views illustrating respective steps for connecting semiconductor devices according to the one embodiment.
Figure 12B:
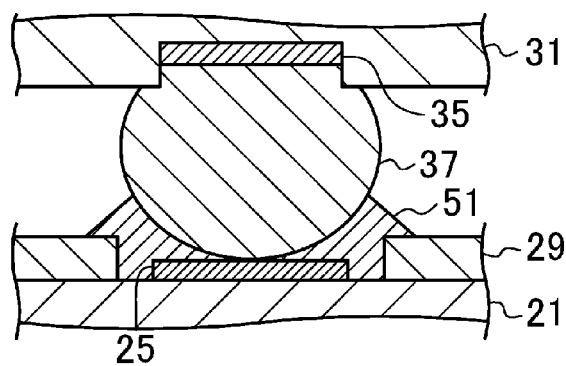
Figure 12C:
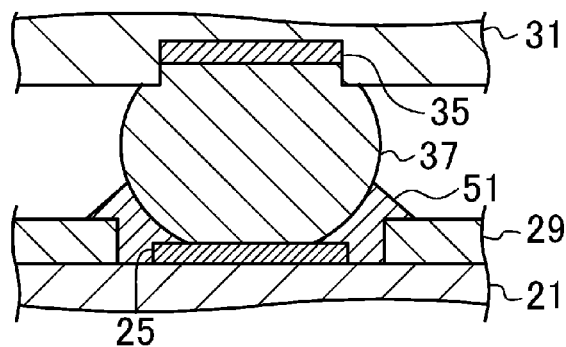

By arranging the first electrode 25 and the opening portion 29a in the above-described manner, the following advantages can be achieved. FIGS. 12A-12C illustrate cross-sectional views illustrating respective steps for connecting the first semiconductor device 20 and the second semiconductor device 30 together. First, as shown in FIG. 12A, due to the action of a connection auxiliary material 51 induced by application of heat, an oxide film formed on surfaces of the first electrode 25 and the solder ball 37 is removed. Next, as shown in FIG. 12B, the connection auxiliary material 51 is pushed away by the melted solder ball 37. In this embodiment, the connection auxiliary material 51 spreads in a space between the first electrode 25 and the insulating layer 29, and the connection auxiliary material 51 hardly remains on the first electrode 25. Thus, as shown in FIG. 12C, the solder ball 37 and the first electrode 25 are easily brought into contact, and the occurrence of a defective connection between the first semiconductor device 20 and the second semiconductor device 30 can be prevented or reduced.

Part of the first electrode 25 is covered by the insulating layer 29. Thus, as compared to the case where the entire first electrode 25 is exposed through the opening portion 29a, adhesion between the first electrode 25 and the first interconnect substrate 21 can be increased. Therefore, reliability of a connection of the first semiconductor device 20 and the second semiconductor device 30 is advantageously increased.

Figure 13A:
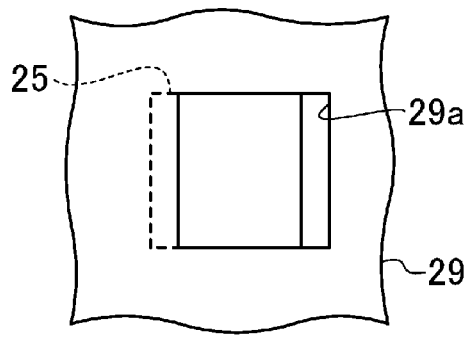
FIGS. 13A-13D are planar views illustrating example arrangements of the first embodiment and an opening portion in the semiconductor device of the one embodiment.
Figure 13B:
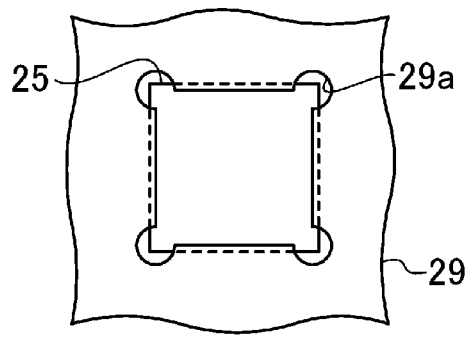
Figure 13C:
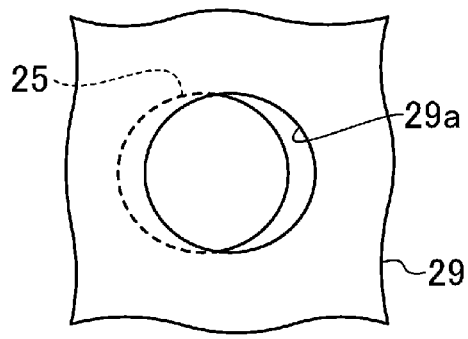
Figure 13D:
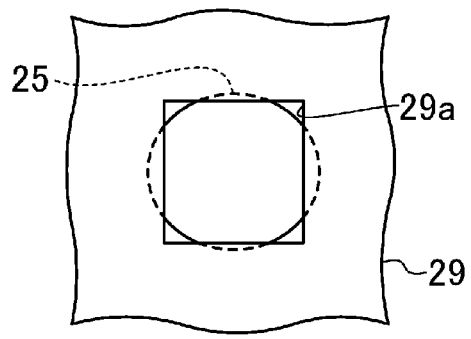

Note that if there is a space into which the connection auxiliary material 51 can flow when the connection auxiliary material 51 is pushed away by the solder ball 37, the solder ball 37 and the first electrode 25 can be easily brought into contact. Therefore, as shown in FIG. 13A, the first electrode 25 and the opening portion 29a can be arranged to be offset parallel to each other. Also, as shown in FIG. 13B, the opening portion 29a may be formed to have a shape with rounded bulges at each corner. Also, the planar shape of the first electrode 25 does not have to be square. For example, as shown in FIG. 13C, a combination of the first electrode 25 having a circular shape and the opening portion 29a having a circular shape may be used. Moreover, as shown in FIG. 13D, a combination of the first electrode 25 having a circular shape and the opening portion 29a having a square shape may be used. A combination of the first electrode 25 having a square shape and the opening portion 29a having a circular shape can be used.

As described above, by providing a space into which the connection auxiliary material 51 which has been pushed away can flow in the opening portion 29a, even when the aspect ratio is large, the incidence of defective connection can be reduced. Also, even when a space into which the connection auxiliary material 51 flows is not provided, the connection auxiliary material 51 can be easily caused to flow away to the outside of the opening portion 29a by setting the aspect ratio of the opening portion 29a, and thus, the incidence of defective connection can be reduced. However, the aspect ratio of the opening portion 29a is restricted by the thickness of the insulating layer 29 and the size of the first electrode 25, etc., and thus, it might be difficult to set the aspect ratio to 0.12 or less. A configuration of FIGS. 14A and 14B allows the connection auxiliary material to flow away to the outside of the opening while ensuring the thickness of the insulating layer.

Figure 14A:
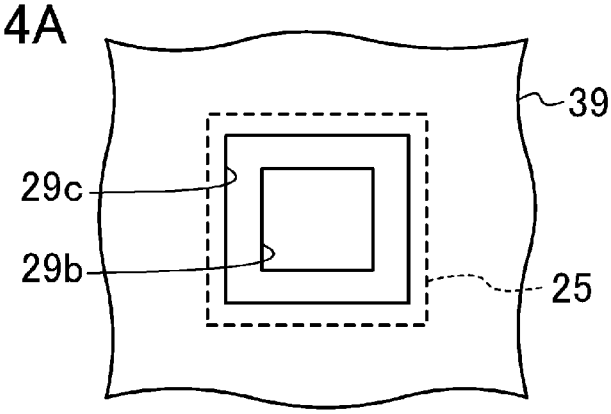
FIGS. 14A and 14B are cross-sectional views of a semiconductor device according to a variation of the one embodiment.
Figure 14B:
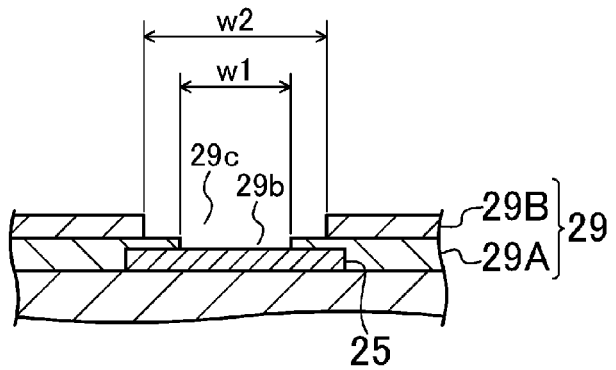

In a variation of FIGS. 14A and 14B, the insulating layer 29 includes a first layer 29A and a second layer 29B formed in this order from a side thereof located closer to the first interconnect substrate. Also, a lower opening portion 29b is formed in the first layer 29A, and an upper opening portion 29c through which the lower opening portion 29b is exposed is formed in the second layer 29B. The upper opening portion 29c has a width w2 which is larger than a width w1 of the lower opening portion 29b. Thus, an area of a portion exposed through the upper opening portion 29c is larger than an area of a portion exposed through the lower opening portion 29b. In other words, the lower opening portion 29b and part of an upper surface of the first layer 29A located around the lower opening portion 29b are exposed through the upper opening portion 29c. With this configuration, as shown in FIGS. 15A and 15B, the connection auxiliary material 51 which has been pushed away from the solder ball 37 spreads onto the first layer 29A, and further spreads onto the second layer 29B. Thus, the connection auxiliary material 51 hardly remains on the first electrodes 25, and the occurrence of a defective connection between the first semiconductor device 20 and the second semiconductor device 30 can be prevented or reduced. In this case, the aspect ratio of the lower opening portion 29b is preferably 0.12 or less.

In this variation, the first electrodes 25, the lower opening portion 29b, and the upper opening portion 29c may have the same planar shape. For example, the first electrodes 25, the lower opening portion 29b, and the upper opening portion 29c can be all formed to have a square or circular planar shape. Also, at least one of the first electrodes 25, the lower opening portion 29b, and the upper opening portion 29c may have a different planar shape from a shape of the other two.

Figure 16A:
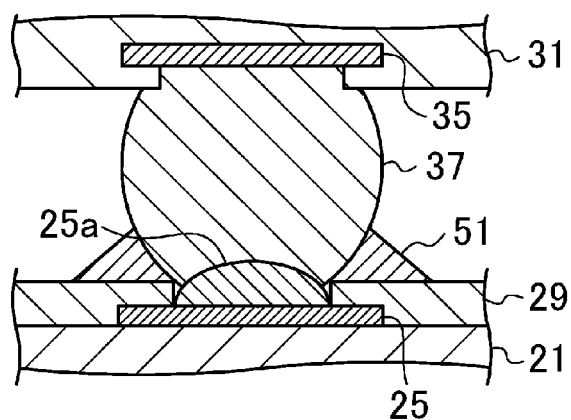
FIGS. 16A and 16B are cross-sectional views of the semiconductor device of the variation of the one embodiment.
Figure 16B:
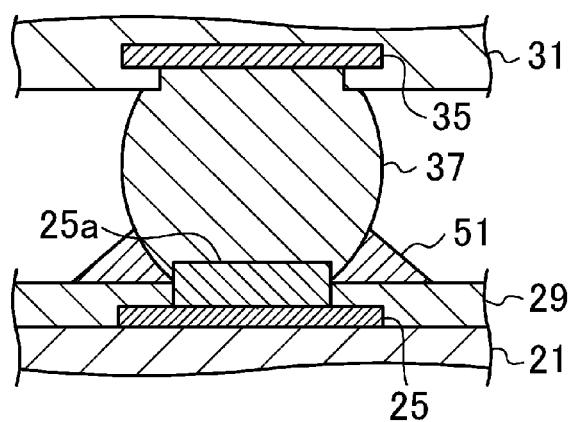

Furthermore, as shown in FIGS. 16A and 16B, a raised portion 25a may be provided in part of the first electrode 25 exposed through the recess portion. For example, the raised portion 25a may be made of solder using a printing method, etc. In this case, the raised portion 25a has, in general, a hemispherical shape, as shown in FIG. 16A. As another option, the raised portion 25a may be made of copper or tin, etc. using an electroplating method. In this case, as shown in FIG. 16B, in general, the raised portion 25a has a parallelepiped shape or a columnar shape. However, the raised portion 25a does not necessarily have to be formed to have such a shape, but may be formed so that an upper end portion of the raised portion 25a protrudes from an upper surface of the insulating layer 29. Even when the upper end portion of the raised portion 25a does not protrudes from the upper surface of the insulating layer 29, the defective connection can be reduced, similarly to when the aspect ratio of the recess portion is set small, as long as a value obtaining by dividing the distance from the upper end portion of the raised portion 25a to the upper surface of the insulating layer 29 by a width of the recess portion is 0.12 or less.

In this variation, each of the first electrode 25 and the opening portion 29a may be formed to have a square or circular planar shape. Also, the first electrode 25 and the opening portion 29a may have different planar shapes from each other.

In this embodiment and this variation, the first electrode 25 may be, for example, a multilayer body including a nickel plated layer and a gold plated layer sequentially formed in this order, or a multilayer body including a nickel plated layer, a palladium plated layer, and a gold plated layer, etc. Also, the first electrode 25 may be made of an alloy of tin and lead, or an alloy of tin, silver, and copper, etc., and may be formed at a predetermined position in the interconnect pattern formed on the first interconnect substrate 21 by performing flux treatment.

An example in which two semiconductor devices are stacked has been described. However, each embodiment of the present disclosure can be applied when three or more semiconductor devices are stacked. The semiconductor devices of this embodiment and the variation are useful also when pre-stacking is used and when on-board stacking is used. Each semiconductor device may include two or more semiconductor elements. The method for bonding a semiconductor element may be either one of wire bonding or a flip chip technique.

FIGS. 11A and 11B show an example in which each of the first electrode 25 and the opening portion 29a has a square planar shape, and the first electrode 25 and the opening portion 29a are arranged so that the vertices of the first electrode 25 are offset from those of the opening portion 29a by 45 degrees. Each of the planner shapes of the first electrode 25 and the opening portion 29a is not limited to a square shape, but may be a polygonal shape with n sides (where n is an integer of 3 or more), the first electrode 25 and the opening portion 29a may be arranged at positions where the vertices of the first electrode 25 are offset from those of the opening portion 29a by 180/n degrees. Also, as long as the vertices of the first electrode 25 do not overlap with those of the opening portion 29a, the angle of the offset does not have to be 180/n degrees.

According to the present disclosure, a multilayer semiconductor device in which the occurrence of a defective connection between semiconductor devices is prevented or reduced and which has high connection reliability can be realized, and therefore, is useful particularly as a multilayer semiconductor device in which a plurality of semiconductor devices are stacked, etc.

What is claimed is:

1. A semiconductor device, comprising:
a first semiconductor device which includes a first interconnect substrate having a first surface and a second surface opposing the first surface, a first semiconductor element provided on the first surface of the first interconnect substrate, an insulating layer which is provided on the first surface of the first interconnect substrate and has an opening portion, and a first electrode provided on the first surface of the first interconnect substrate,
wherein a first part of a top surface and a first part of side surfaces of the first electrode are exposed through the opening portion of the insulating layer, and a second part of the top surface and a second part of the side surfaces are covered by the insulating layer,
the part of the top surface of the first electrode exposed through the opening portion has a smaller area than that of the opening portion,
a pair of the side surfaces of the first electrode which oppose each other has a gap between the internal wall of the opening portion of the insulating layer,
a part of the first interconnect substrate on which the first electrode is not formed is exposed through the opening portion,
the first electrode and the opening portion have the same planar shape and area,
each of the planar shape of the first electrode and the planar shape of the opening portion is a polygonal shape with n sides, and
the first electrode is arranged in a position rotated relative to the opening portion by 180/n degrees.

2. A semiconductor device, comprising:
a first semiconductor device; and
a second semiconductor device stacked on the first semiconductor device,
wherein the first semiconductor device includes a first interconnect substrate, a first semiconductor element provided on an upper surface of the first interconnect substrate, a first electrode provided on the upper surface of the first interconnect substrate, and an insulating layer which is provided on the upper surface of the first interconnect substrate and has an opening portion through which part of the first electrode is exposed,
the second semiconductor device includes a second interconnect substrate, a second semiconductor element provided on an upper surface of the second interconnect substrate, a second electrode provided on a lower surface of the second interconnect substrate, and an inter-device connection terminal connected to the second electrode,
the insulating layer includes a first layer and a second layer stacked in this order from a side thereof located closer to the first interconnect substrate,
the opening portion includes a lower opening portion formed in the first layer and an upper opening portion formed in the second layer, and
the upper opening portion has a larger width than a width of the lower opening portion.

3. The semiconductor device of claim 2, wherein an aspect ratio of the lower opening portion is 0.12 or less.

4. A semiconductor device, comprising:
a first semiconductor device which includes a first interconnect substrate having a first surface and a second surface opposing the first surface, a first semiconductor element provided on the first surface of the first interconnect substrate, an insulating layer which is provided on the first surface of the first interconnect substrate and has an opening portion, and a first electrode provided on the first surface of the first interconnect substrate, and
a second semiconductor device stacked on the first surface of the first semiconductor device includes a second interconnect substrate having a third surface and a fourth surface opposing to the third surface, a second semiconductor element provided on an the third surface of the second interconnect substrate, a second electrode provided on the fourth surface of the second interconnect substrate, and an inter-device connection terminal connected to the second electrode,
wherein a first part of a top surface and a first part of side surfaces of the first electrode are exposed through the opening portion of the insulating layer, and a second part of the top surface and a second part of the side surfaces are covered by the insulating layer,
the part of the top surface of the first electrode exposed through the opening portion has a smaller area than that of the opening portion, and
a pair of the side surfaces of the first electrode which oppose each other has a gap between the internal wall of the opening portion of the insulating layer.

5. A semiconductor device, comprising:
a first semiconductor device which includes a first interconnect substrate having a first surface and a second surface opposing the first surface, a first semiconductor element provided on the first surface of the first interconnect substrate, an insulating layer which is provided on the first surface of the first interconnect substrate and has an opening portion, and a first electrode provided on the first surface of the first interconnect substrate, and
a second semiconductor device stacked on the first surface of the first semiconductor device includes a second interconnect substrate having a third surface and a fourth surface opposing to the third surface, a second semiconductor element provided on an the third surface of the second interconnect substrate, a second electrode provided on the fourth surface of the second interconnect substrate, and an inter-device connection terminal connected to the second electrode,
wherein a first part of a top surface and a first part of side surfaces of the first electrode are exposed through the opening portion of the insulating layer, and a second part of the top surface and a second part of the side surfaces are covered by the insulating layer,
the part of the top surface of the first electrode exposed through the opening portion has a smaller area than that of the opening portion,
a pair of the side surfaces of the first electrode which oppose each other has a gap between the internal wall of the opening portion of the insulating layer, and
the first electrode includes a raised portion with an upper end portion which protrudes from an upper surface of the insulating layer.

6. A semiconductor device, comprising:
a first semiconductor device includes a first interconnect substrate having a first surface and a second surface opposing to the first surface, a first semiconductor element provided on the first surface of the first interconnect substrate, a first electrode provided on the upper surface of the first interconnect substrate, and an insulating layer which is provided on the first surface of the first interconnect substrate, wherein the insulating layer includes a first layer and a second layer stacked in this order from a side thereof located closer to the first interconnect substrate, a part of a top surface of the first electrode is exposed through an opening portion of the insulating layer including a lower opening portion in the first layer and a upper opening portion in the second layer, and the upper opening portion has a larger width than a width of the lower opening portion.

7. A semiconductor device, comprising:
a first semiconductor device which includes a first interconnect substrate having a first surface and a second surface opposing the first surface, a first semiconductor element provided on the first surface of the first interconnect substrate, an insulating layer which is provided on the first surface of the first interconnect substrate and has an opening portion, and a first electrode provided on the first surface of the first interconnect substrate, wherein a first part of a top surface and a first part of side surfaces of the first electrode are exposed through the opening portion of the insulating layer, and a second part of the top surface and a second part of the side surfaces are covered by the insulating layer, the part of the top surface of the first electrode exposed through the opening portion has a smaller area than that of the opening portion, a pair of the side surfaces of the first electrode which oppose each other has a gap between the internal wall of the opening portion of the insulating layer, and the first electrode is disposed on the outer side of the area first semiconductor element is located.

8. The semiconductor device of claim 7, wherein the first electrode is configured to connect an electrode of other device.

* * * * *